United States Patent
Hotzel

(10) Patent No.: US 8,518,189 B2
(45) Date of Patent: Aug. 27, 2013

(54) VAPOR CLEAN FOR HAZE AND PARTICLE REMOVAL FROM LITHOGRAPHIC PHOTOMASKS

(75) Inventor: Arthur Hotzel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 196 days.

(21) Appl. No.: 12/958,685

(22) Filed: Dec. 2, 2010

(65) Prior Publication Data
US 2012/0138095 A1  Jun. 7, 2012

(51) Int. Cl.
*B08B 3/10* (2006.01)

(52) U.S. Cl.
USPC .............................. 134/31; 134/33

(58) Field of Classification Search
USPC ............... 134/31, 33; 156/345.52, 345.53
See application file for complete search history.

(56) References Cited

U.S. PATENT DOCUMENTS

| | | | | |
|---|---|---|---|---|
| 5,332,445 A * | 7/1994 | Bergman | | 134/3 |
| 5,494,526 A * | 2/1996 | Paranjpe | | 134/1 |
| 5,716,458 A * | 2/1998 | Machino | | 134/42 |
| 7,416,611 B2 * | 8/2008 | Bergman | | 134/30 |
| 2007/0128552 A1* | 6/2007 | Sawada et al. | | 430/311 |
| 2009/0286334 A1* | 11/2009 | Christenson et al. | | 438/14 |

* cited by examiner

*Primary Examiner* — Michael Kornakov
*Assistant Examiner* — Natasha Campbell
(74) *Attorney, Agent, or Firm* — Ditthavong Mori & Steiner, P.C.

(57) ABSTRACT

A reticle is cleaned by vapor condensing on the active surface of the reticle. An embodiment includes positioning the reticle in a cleaning chamber having a bottom surface, with the active surface of the reticle facing the bottom surface of the cleaning chamber, and directing vapor at the active surface of the reticle. Embodiments further include filling a reservoir in a bottom portion of the cleaning chamber with liquid and directing vapor by heating the liquid. Embodiments further include cooling the reticle concurrently with heating the liquid. Embodiments further include rotating the reticle concurrently with heating the liquid and cooling the reticle. Embodiments further include emptying the reservoir and dry spinning the reticle, subsequent to cleaning the reticle.

11 Claims, 4 Drawing Sheets

VAPOR CLEAN FOR HAZE AND PARTICLE REMOVAL FROM LITHOGRAPHIC PHOTOMASKS

TECHNICAL FIELD

The present disclosure relates to improved cleaning processes for lithographic photomasks, or reticles. The present disclosure is particularly applicable to technologies that employ 193 nanometer (nm) lithography, or technologies of 90 nm and beyond (i.e. <90 nm), as well as EUV (extreme ultra violet) lithography.

BACKGROUND

A lithographic photomask, or reticle, often needs to be re-cleaned during its lifetime. This is particularly true for reticles for lithography with 193 nm wavelength, since they develop crystal growth (so-called haze) during use, which has to be removed by a wet clean typically at intervals of a few months. Another class of reticles that can be expected to need regular re-cleans are the reticles for EUV lithography (which will enter into production in a few years), since these reticles have no protective pellicle (organic membrane on a frame over the active surface) and, therefore, no protection against particles falling onto the patterned surface. Both haze (which is water soluble) and fall-on particles (which are usually much bigger than the structures on the reticle) are relatively easy to remove. However, 193 nm reticles have protective pellicles glued to the front surface, and for re-cleans the pellicle needs to be removed first, which can leave residues of the pellicle adhesive close to the active surface. Reticle cleaning is usually done by dispensing liquid on the patterned surface through a nozzle, mostly with the addition of aggressive chemicals or megasonic power or both. However, the cleaning process itself can leave additional contamination of the surface or damage the patterned surface mechanically, which often leads to costly and time-consuming repair-clean-inspection cycles. Occasionally, the reticle is damaged beyond repair and needs to be replaced. Consequently, re-cleans must be done in mask shops outside the wafer production sites (fabs), which further adds to the cycle time.

Attempts have been made to avoid using adhesive by mechanically attaching the pellicle to the reticle, as disclosed in the copending application entitled, "Mechanical Fixture of Pellicle to Lithographic Photomask," filed on Dec. 2, 2010, as application Ser. No. 12/958678. Further, since EUV reticles do not have pellicles, the problem of removing glue residuals does not exist for them, but more frequent cleaning is necessary. In both cases, relatively mild cleaning processes would be sufficient to remove haze and/or fall-on particles, while having minimum risk of adding contamination to or damaging the patterned reticle surface.

A need thus exists for methodology and apparatus enabling milder cleaning of a reticle with minimum risk of contamination or damage to the active surface of the reticle.

SUMMARY

An aspect of the present disclosure is a method of cleaning a reticle by directing vapor at the reticle.

Another aspect of the present disclosure is an apparatus for directing vapor at a reticle for cleaning the reticle.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method for cleaning a reticle, the method comprising: positioning the reticle in a cleaning chamber; and directing vapor at the active surface of the reticle.

Aspects of the present disclosure include positioning the reticle in the cleaning chamber, with the active surface of the reticle facing downwards. Further aspects include filling a reservoir in the cleaning chamber with a liquid prior to directing vapor, and directing vapor by heating the reservoir and producing vapor. Another aspect includes rotating the reticle concurrently with heating the liquid. Another aspect includes cooling the reticle concurrently with heating the liquid and rotating the reticle. Additional aspects include cooling the reticle to a temperature of 5° C. to 40° C.; and rotating the reticle at 1 rotation per second (rps) to 10 rps. Other aspects include heating the reservoir, cooling the reticle, and rotating the reticle for 5 minutes to 1 hour. Further aspects include heating the reservoir to a temperature within 10° C. of the boiling point of the liquid. Additional aspects include emptying the reservoir; and dry spinning the reticle, subsequent to directing vapor at the reticle. Another aspect includes heating the reticle concurrently with dry spinning. Further aspects include adding a surfactant to the liquid. Further aspects include heating the cleaning liquid to a temperature within 10° C. of the boiling point of the cleaning liquid. Other aspects include dry spinning the reticle at 5 rps to 50 rps for 1 minute to 10 minutes.

Another aspect of the present disclosure is an apparatus for cleaning a reticle, the apparatus comprising: a cleaning chamber; a holder for holding the reticle in a horizontal position with the active side facing downwards in the cleaning chamber; a liquid reservoir in the cleaning chamber; and a heater for heating liquid in the reservoir.

Aspects of the present disclosure include a means for rotating the reticle in the cleaning chamber. Further aspects include a cooling plate, having a top surface and a bottom surface, above the position where the reticle is held. Other aspects include means for heating the cooling plate. Another aspect includes a reticle spaced 0.01 millimeters (mm) to 2 mm from the bottom surface of the cooling plate. Another aspect includes actuators for moving the reticle vertically in and out of position and for holding the reticle in place. Additional aspects include actuators configured to move the reticle vertically downward to a position 1 mm to 5 mm below the cooling plate and hold the reticle in place. Other aspects include a funnel on the top surface of the cooling plate for condensing vapor and directing the condensed liquid onto a top surface (i.e. the back side) of the reticle.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure enables cleaning of a reticle with vapor condensation. In accordance with embodiments of the present disclosure, a reticle with no pellicle or from which the pellicle has been previously removed is vapor cleaned. The reticle is mounted to a cooling plate in a cleaning chamber, and a liquid below the reticle is heated. Vapor fills the chamber and condenses on the reticle surface, and then condensed liquid flows back downward. The mask is rotated to ensure radial flow of condensed liquid away from the active region. Since common forms of haze are water soluble, they may be removed with low risk of damage to the reticle or of additional contamination. Further, particles and loose contamination may be removed with the vapor condensation.

Methodology in accordance with embodiments of the present disclosure includes positioning the reticle in a cleaning chamber, with the active surface of the reticle facing downwards, and directing vapor at the active surface of the reticle.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
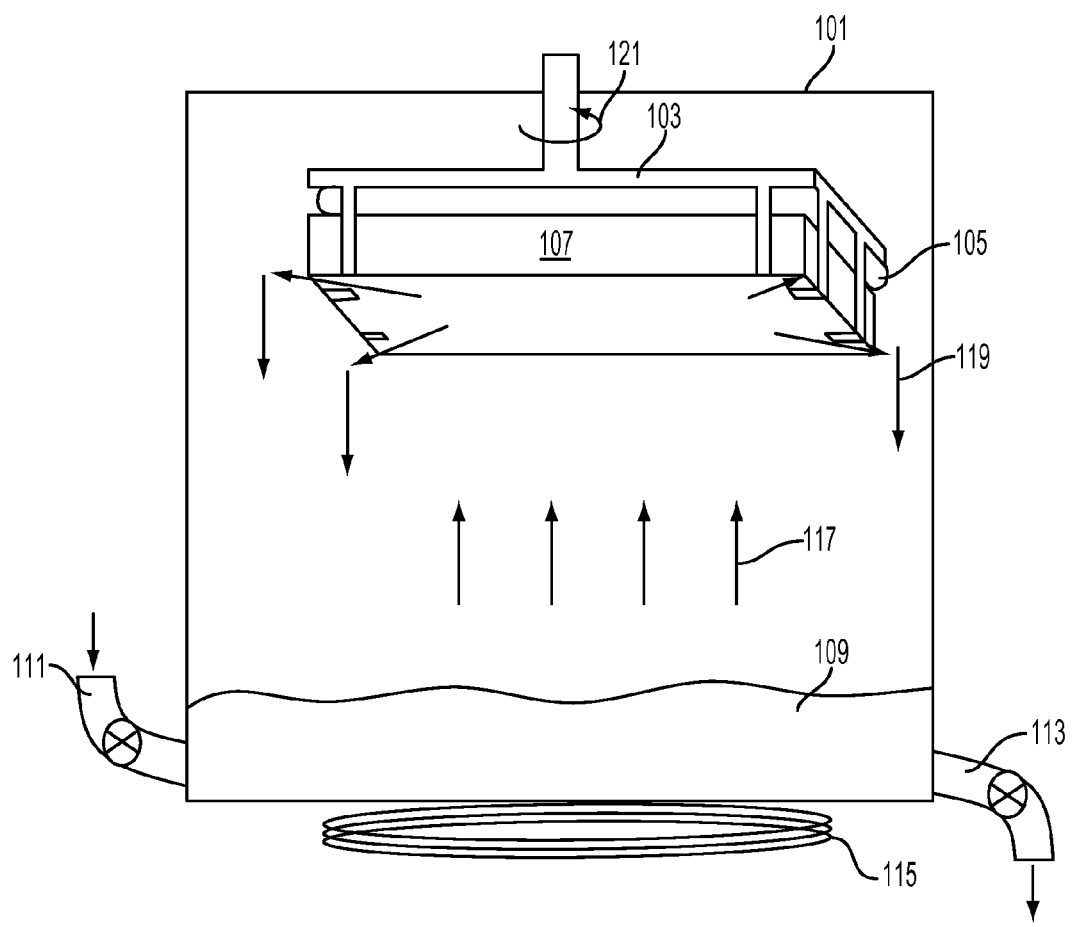
FIG. 1 schematically illustrates an apparatus for cleaning a reticle, in accordance with an exemplary embodiment.

FIG. 1 schematically illustrates an apparatus for cleaning a reticle, in accordance with an exemplary embodiment. Adverting to FIG. 1, inside a cleaning chamber 101, a reticle holder 103 includes a cooling plate 105 (cooled, for example, by Peltier elements) attached thereto in a horizontal position. Reticle holder 103 maintains a reticle 107, for example an EUV reticle or a reticle with the pellicle removed therefrom, in a horizontal position (with the active surface facing the bottom of the cleaning chamber) below a bottom surface of and spaced from cooling plate 105. The reticle may alternatively be positioned in direct contact with cooling plate 105, but with risk of smudges or scratches. A further alternative may eliminate the cooling plate, since the thermal capacity of the reticle, which is initially at room temperature, will already ensure vapor condensation on the active surface for a few minutes (until the reticle is warmed up); if this time is sufficient to remove the haze or particles, cooling of the reticle will not be necessary. A reservoir 109 in cleaning chamber 101, for example in a bottom portion of cleaning chamber 101, is filled with liquid, for example water, via inlet 111 and is emptied via outlet 113. The liquid may include a surfactant, e.g., isopropanol, to prevent drying marks from developing on reticle 107 during cleaning.

During a cleaning operation, heater 115 heats the liquid in reservoir 109 to a temperature within 10° C. of the boiling point of the liquid, for example to a temperature of 90° C. to 110° C., e.g. 95° C., for water, forming vapor 117. Vapor 117 rises towards the bottom surface of reticle 107. Concurrently, cooling plate 105 is cooled to a temperature of 5° C. to 40° C., for example 10° C. Vapor 117 fills the chamber and condenses on the surface of reticle 107. The condensed liquid 119 dissolves haze that has formed on reticle 107 and flows back down to reservoir 109. Condensed liquid 119 may also remove particles that have contaminated reticle 107. Reticle 107 may be rotated (as indicated by arrow 121) at a speed of 1 rps to 10 rps, to ensure radial flow of condensed liquid 119 away from the active region of reticle 107. The rotation speed should be fast enough to force the condensed liquid to the edges of reticle 107, but slow enough to prevent the liquid film on the reticle surface from rupturing. The cleaning process (i.e., heating the liquid while cooling and rotating reticle 107) may continue for 5 minutes to one hour, for example 10 minutes.

When cleaning is complete, reticle 107 may be dried, e.g., for 1 minute to 10 minutes. Heater 115 may be turned off, cooling plate 105 may be heated, reservoir 109 may be emptied, and the rotation speed of the reticle may be increased to 5 rps to 50 rps for drying. Once reticle 107 is dry, a pellicle may be remounted thereon, e.g., for photolithographic reticles.

Figure 2A:
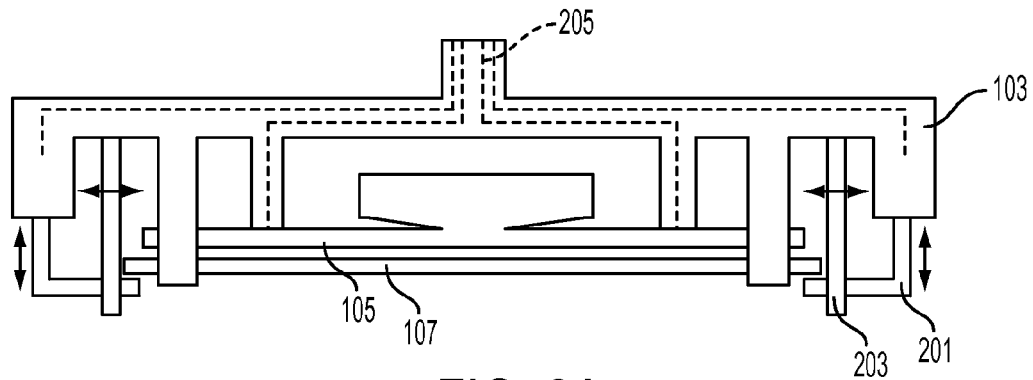
FIGS. 2A through 2D schematically illustrate a side view, a back view, a cross sectional view, and a top view, respectively, of a reticle holder and cooling plate, in accordance with an exemplary embodiment.
Figure 2B:
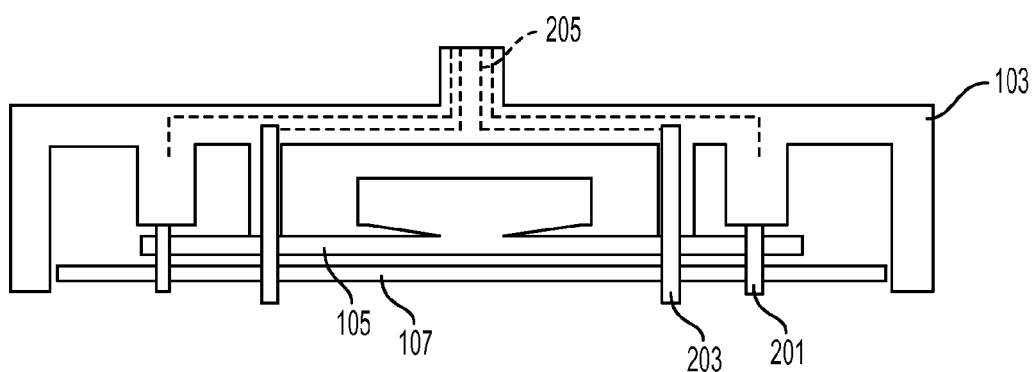
Figure 2C:
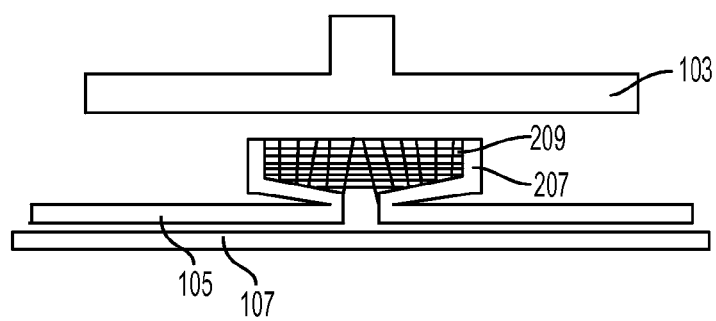
Figure 2D:
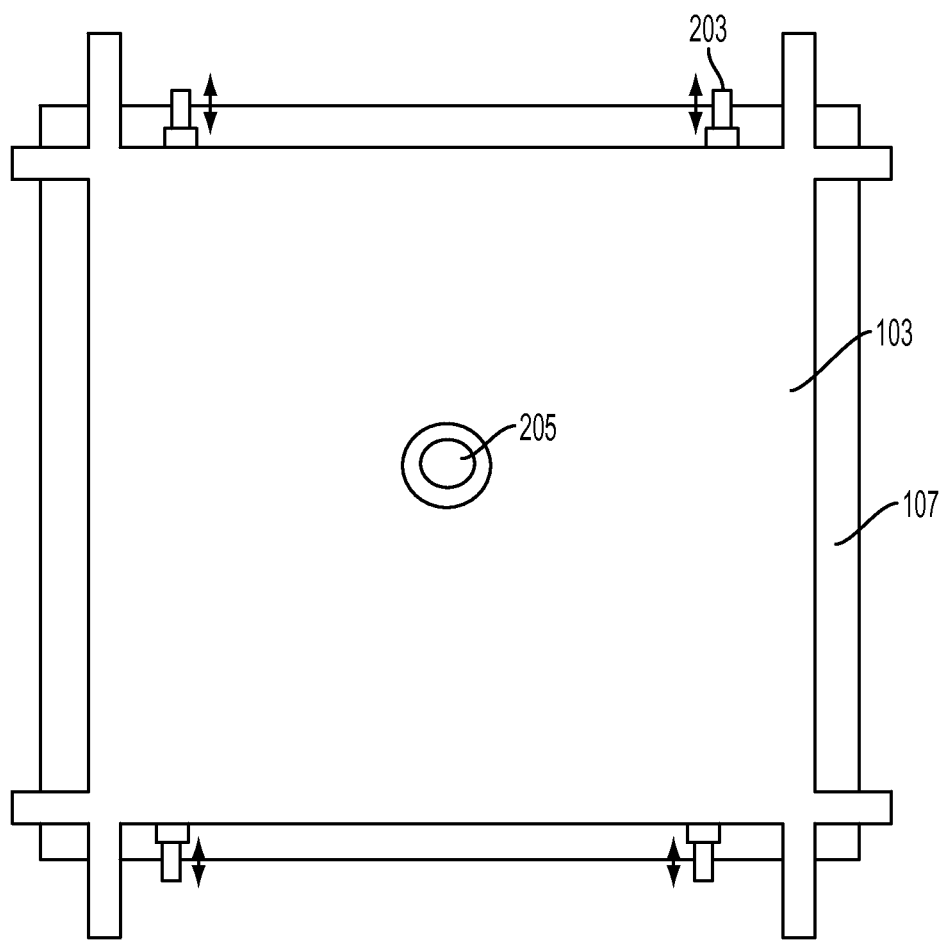

FIGS. 2A through 2D schematically illustrate a side view, a back view, a cross sectional view, and a top view, respectively, of reticle holder 103 and cooling plate 105, in accordance with an exemplary embodiment. As illustrated in FIGS. 2A and 2B, reticle holder 103 includes actuators 201, which move vertically, and actuators 203, which move horizontally. The movement and function of actuators 201 and 203 will be described with respect to FIGS. 3A through 3C. Electrical connections 205, shown as dashed lines, provide power to actuators 201 and 203 and to cooling plate 105. Adverting to FIG. 2C, cooling plate 105 may include a funnel 207, with a metal mesh 209, to direct condensed liquid to the back side of reticle 107. Alternatively, instead of metal mesh 209, funnel 207 may include any structure designed to increase the surface area and promote condensation inside the funnel.

Figure 3A:
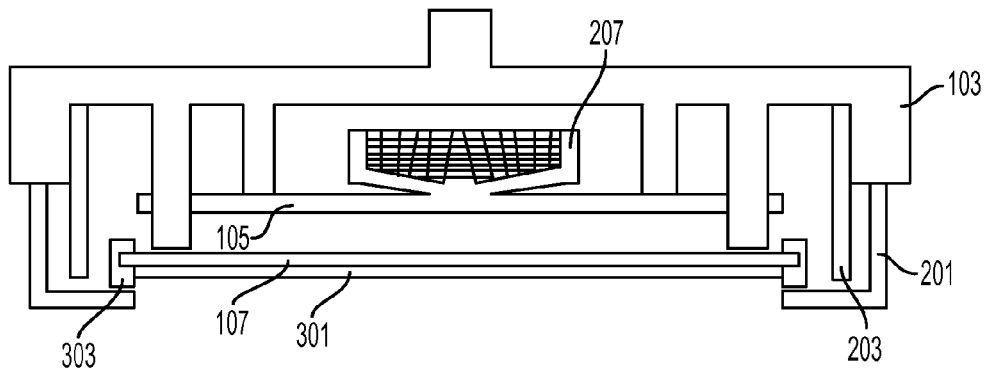
FIGS. 3A through 3C schematically illustrate positions of the actuators during loading and unloading the reticle, cleaning the reticle, and drying the reticle, respectively, in accordance with an exemplary embodiment.
Figure 3B:
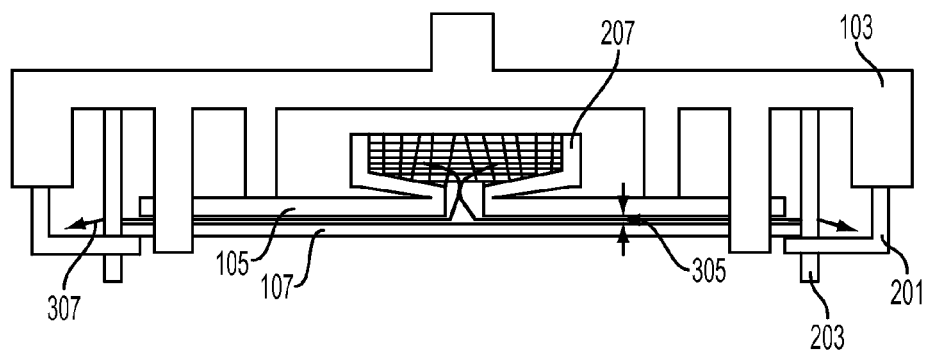
Figure 3C:
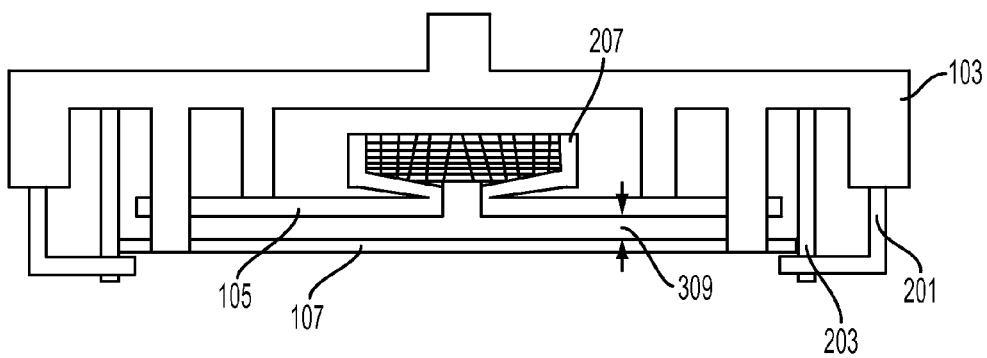

FIGS. 3A through 3C schematically illustrate positions of the actuators during loading and unloading the reticle, cleaning the reticle, and drying the reticle, respectively, in accordance with an exemplary embodiment. Adverting to FIG. 3A, actuators 201 are moved to their lowest position, and actuators 203 are moved to their outward most position, for loading reticle 107 in reticle holder 103. As illustrated in FIG. 3A, for a reticle 107 which has a pellicle 301 mechanically attached thereto, for example with a clamp 303 (as described in copending application entitled, "Mechanical Fixture of Pellicle to Lithographic Photomask"), the reticle is loaded with the pellicle. Pellicle 301 and clamp 303 are then removed and transferred to an adjacent chamber. Alternatively, the pellicle might be removed before loading the reticle, or the reticle might be an EUV reticle which has no pellicle.

For the cleaning process, actuators 201 and 203 are moved upward and inward, respectively, leaving a small gap 305, e.g., 0.01 mm to 2 mm, for example 0.1 to 0.5 mm, between reticle 107 and cooling plate 105, as illustrated in FIG. 3B. Gap 305 allows liquid 307 that condenses in funnel 207 to flow from the funnel through the gap, providing good thermal coupling while simultaneously flushing the back side of the reticle and ensuring that no smudges or scratches are added to the back side by direct contact with the cooling plate. After cleaning is complete, actuators 201 are moved downward by 1 mm to 10 mm, thereby increasing the gap between cooling plate 105 and reticle 107 to enable efficient drying. The exact distance from the cooling plate during drying will depend on the temperature at which the reticle has been held during cleaning. For example, if the reticle has been cooled to a temperature below room temperature, a smaller distance (e.g. 1 mm) may be suitable to warm the reticle back up to room temperature in a short time. If the reticle has been held at a higher temperature, a larger distance (e.g. 5 mm or more) may facilitate drying. Actuators 201 and 203 are then returned to the positions shown in FIG. 3A for unloading reticle 107.

The embodiments of the present disclosure can achieve several technical effects, including reducing the risk of contamination or damage to the reticle during haze removal, thereby increasing the first time success rate, saving repair costs, additional cleaning, and additional inspection of the reticle, and allowing haze removal to be performed in the fab, thereby reducing cycle time. Consequently manufacturing costs are reduced while throughput is increased. The present disclosure enjoys industrial applicability in any of various types of highly integrated semiconductor devices, especially 90 nm node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method for cleaning a reticle, the method comprising:
    positioning the reticle inside a cleaning chamber with the active surface of the reticle facing downwards;
    directing water vapor at the active surface of the reticle;
    lowering the reticle within the cleaning chamber subsequent to directing water vapor at the active surface of the reticle; and
    drying the reticle.

2. The method as recited in claim 1, further comprising filling a reservoir in the cleaning chamber with liquid prior to directing water vapor, and directing water vapor by heating the reservoir and producing water vapor.

3. The method as recited in claim 2, further comprising rotating the reticle concurrently with heating the liquid.

4. The method as recited in claim 3, further comprising cooling the reticle concurrently with heating the liquid and rotating the reticle.

5. The method as recited in claim 4, comprising:
    cooling the reticle to a temperature of 5° C. to 40° C.; and
    rotating the reticle at 1 rotation per second (rps) to 10 rps.

6. The method as recited in claim 5, comprising heating the liquid reservoir, cooling the reticle, and rotating the reticle for 5 minutes to 1 hour.

7. The method as recited in claim 6, further comprising:
    emptying the reservoir; and
    dry spinning the reticle, subsequent to directing water vapor at the reticle.

8. The method as recited in claim 7, further comprising heating the reticle concurrently with dry spinning.

9. The method as recited in claim 2, further comprising adding a surfactant to the liquid.

10. A method for cleaning a reticle, the method comprising:
    positioning the reticle in a cleaning chamber 0.01 millimeters (mm) to 2 mm from a bottom surface of a cooling plate within the cleaning chamber, with the active surface facing downwards;
    filling a reservoir in the cleaning chamber with cleaning liquid with an added surfactant;
    cooling the reticle to a temperature of 5° C. to 40° C.;
    heating the surfactant cleaning liquid to a temperature within 10° C. of the boiling point of the cleaning liquid; and
    rotating the reticle at 1 rotation per second (rps) to 10 rps, wherein cooling the reticle, heating the surfactant cleaning liquid, and rotating the reticle are performed concurrently for 5 minutes to 1 hour; and
    lowering the reticle away from the cooling plate subsequent to the 5 minutes to 1 hour; and drying the reticle.

11. The method as recited in claim 10, further comprising:
    emptying the reservoir, subsequent to cooling the reticle, heating the surfactant cleaning liquid, and rotating the reticle;
    terminating the cooling of the reticle and the heating of the reservoir;
    lowering the reticle to 1 mm to 10 mm below the cooling plate;
    heating the cooling plate; and
    dry spinning the reticle at 5 rps to 50 rps for 1 minute to 10 minutes.

* * * * *